United States Patent
Sugimoto

(10) Patent No.: US 7,820,364 B2
(45) Date of Patent: Oct. 26, 2010

(54) SEMICONDUCTOR DEVICE MANUFACTURING METHOD, MASK MANUFACTURING METHOD, AND EXPOSURE METHOD

(75) Inventor: Fumitoshi Sugimoto, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 677 days.

(21) Appl. No.: 11/411,019

(22) Filed: Apr. 26, 2006

(65) Prior Publication Data
US 2007/0166627 A1    Jul. 19, 2007

(30) Foreign Application Priority Data
Jan. 16, 2006    (JP)    ............. 2006-007327

(51) Int. Cl.
*G03F 7/00*    (2006.01)
*G03F 1/00*    (2006.01)
*G03C 5/00*    (2006.01)
(52) U.S. Cl. ............. 430/311; 430/5; 430/394
(58) Field of Classification Search ......... 430/5, 430/311, 394
See application file for complete search history.

(56) References Cited

U.S. PATENT DOCUMENTS

| | | | |
|---|---|---|---|
| 5,436,095 A * | 7/1995 | Mizuno et al. ................. 430/5 |
| 5,523,186 A * | 6/1996 | Lin et al. ....................... 430/5 |
| 6,351,304 B1 * | 2/2002 | Kawashima et al. .......... 355/55 |
| 6,660,462 B1 * | 12/2003 | Fukuda ...................... 430/394 |
| 6,811,954 B1 | 11/2004 | Fukuda |
| 6,818,385 B2 * | 11/2004 | Wang et al. ................. 430/311 |
| 2003/0203291 A1 * | 10/2003 | Misaka .......................... 430/5 |
| 2005/0142457 A1 * | 6/2005 | Lee ................................ 430/5 |

FOREIGN PATENT DOCUMENTS

WO    WO 01/63653 A1    8/2001

* cited by examiner

*Primary Examiner*—Stephen Rosasco
*Assistant Examiner*—Stewart A Fraser
(74) *Attorney, Agent, or Firm*—Westerman, Hattori, Daniels & Adrian, LLP

(57) ABSTRACT

In order to form a transfer pattern of desired size with high accuracy, a method for manufacturing a semiconductor device includes a process of forming the transfer pattern including a line whose width and angle varies, by performing multiple exposure using a plurality of masks having different patterns over different mask substrates.

10 Claims, 14 Drawing Sheets

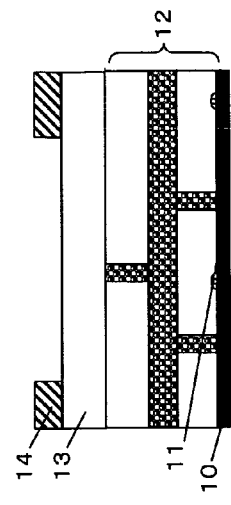
FIG. 3 (A)
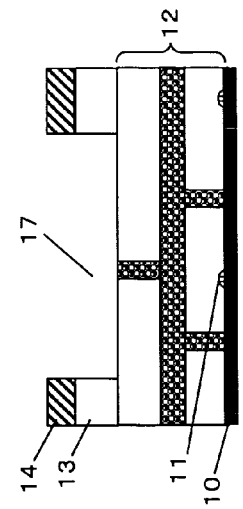
FIG. 3 (B)
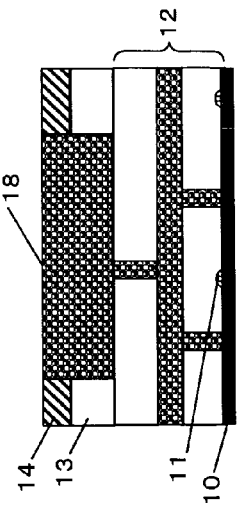
FIG. 3 (C)
FIG. 3 (D)
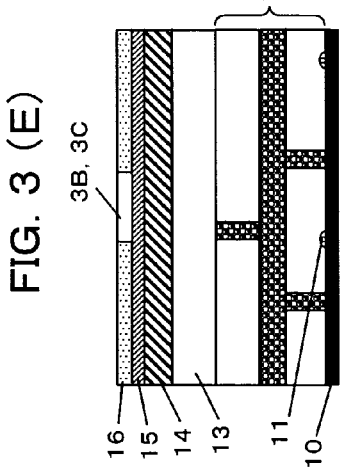
FIG. 3 (E)
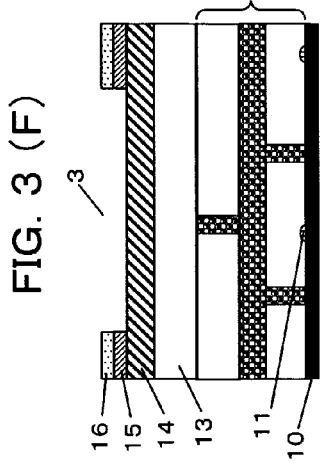
FIG. 3 (F)
FIG. 3 (G)
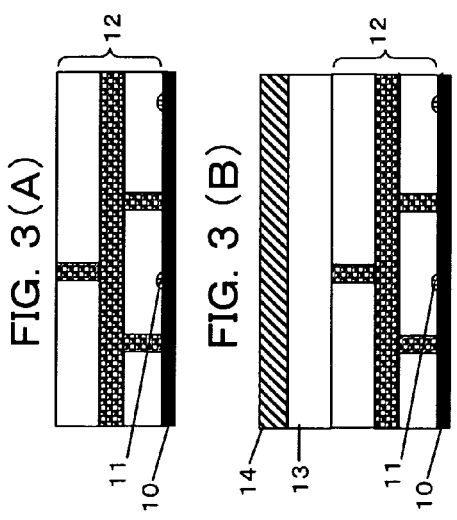
FIG. 3 (H)
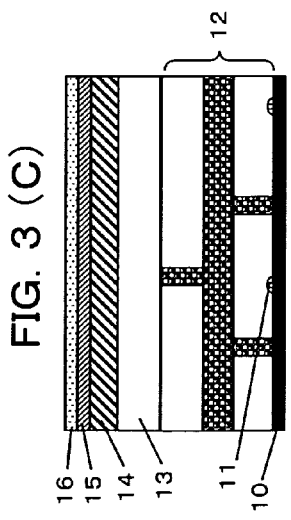
FIG. 3 (I)
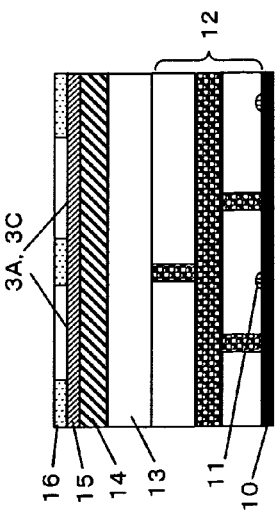
FIG. 3 (J)

SEMICONDUCTOR DEVICE MANUFACTURING METHOD, MASK MANUFACTURING METHOD, AND EXPOSURE METHOD

CROSS REFERENCE TO RELATED APPLICATIONS

This application is based on and hereby claims priority to Japanese Application No. 2006-007327 filed on Jan. 16, 2006 in Japan, the contents of which are hereby incorporated by reference.

BACKGROUND OF THE INVENTION (1) Field of the Invention

The present invention relates to an exposure method suitable for use in a photolithography process, a method for manufacturing a semiconductor device using the exposure method, and a method for manufacturing a mask (an exposure mask) for use in the exposure method.

(2) Description of Related Art

In recent years, it has become necessary to form a device pattern of an extremely small size over a semiconductor substrate to meet requirements of high speed and high density in the semiconductor device.

Fine patterning of the device pattern has been achieved by shortening a light source wavelength of an exposure apparatus being used in the photolithography process. At present, the rule of the semiconductor device has reached the level of 100 nm or less. Such a size is shorter than the light source wavelength of the exposure apparatus used when transferring a mask pattern in the photolithography process. By way of example, an argon fluoride (ArF) excimer laser used as the light source has a wavelength of 193 nm.

As such, when transferring the mask pattern onto the substrate by the photolithography, if the resolution limit is exceeded, the shape of a tip position, etc. of the pattern transferred onto the substrate varies due to an optical proximity effect such as diffraction, producing a difference between the mask pattern size and the pattern size transferred onto the substrate.

For example, in a wiring process at the time of manufacturing the semiconductor device, there is a case that a mask pattern 102 such as shown in FIG. 15, in which a narrow width portion 100 (for example, 100 nm in width) and a wide width portion 101 (for example, 550 nm in width) are mixedly provided, is transferred onto the substrate. In this FIG. 15, the portion filled with black depicts a portion through which light transmits.

Now, FIG. 14 shows a schematic cross-sectional view illustrating a wiring structure of the semiconductor device.

As shown in FIG. 14, a wiring layer 111 is constituted as including a lower layer 112, a middle layer 113 and an upper layer 114. Here, an interlayer film is omitted in FIG. 14. Further, in FIG. 14, a symbol 115 represents a semiconductor substrate, and a symbol 116 represents a gate pattern, respectively.

In addition, although the wiring layer is constituted as including the middle layer 113 in the above structure, it may also be possible to structure in such a way as to directly connect the lower layer 112 and the upper layer 114, without providing the middle layer 113.

Here, generally, the wiring widths (minimum wiring widths) formed over the respective layers 112, 113 and 114 constituting the wiring layer 111 are mutually different.

For example, as the case may be, the minimum wiring width formed over the lower layer 112 is 100 nm, the minimum wiring width formed over the middle layer 113 is 200 nm, and the minimum wiring width formed over the upper layer 114 is 400 nm.

In the above case, at the layer connecting the lower layer 112 and the middle layer 113, a mask pattern including both the wiring having the line width of 100 nm and the wiring having the line width of 200 nm is to be transferred onto the substrate. Also, at the layer connecting the lower layer 112 and the upper layer 114, a mask pattern including both the wiring having the line width of 100 nm and the wiring having the line width of 400 nm is to be transferred onto the substrate.

For example, when transferring the mask pattern 102 (mask pattern including wiring of different line widths) such as shown in FIG. 15, in which the narrow width portion 100 and the wide width portion 101 are mixedly provided, at a corner portion 103 or the narrow width portion 100 in the mask pattern 102, the resolution limit is exceeded. As a result, as shown in FIG. 16, a pattern (transfer pattern) 104 transferred onto the substrate undesirably comes to have a narrow width portion 105 thicker than a desired size according to the narrow width portion 100 in the mask pattern 102, as well as a corner portion 106 smaller than a desired size according to the corner portion 103 in the mask pattern 102.

To cope with the above problem, there have been proposed a variety of methods to restrain the influence caused by the optical proximity effect. For example, as a method for correcting the difference between the mask pattern 102 such as shown in FIG. 15 and the transfer pattern 104 such as shown in FIG. 16, a technique for performing optical proximity correction (OPC) has been proposed.

The OPC corrects the variations in shape and size of the pattern transferred onto the substrate, either by partially varying a shape in the opposite way to a pattern deformation produced when transferring the mask pattern in advance (for example, by enlarging the corner portion 103 of the mask pattern 102, or making the narrow width portion 100 still narrower), or by providing a dummy pattern.

For example, when transferring the mask pattern 102 such as shown in FIG. 15 onto the substrate, in order to prevent the deformation of the transfer pattern 104 in shape and size such as shown in FIG. 16, a corrected narrow width portion (correction pattern) 107 is formed using the OPC, by intentionally making the narrow width portion 100 of the mask pattern 102 still narrower, as shown in FIG. 17. Also, the corner portion 103 of the wide width portion 101 is intentionally enlarged by adding an auxiliary pattern 108, which is called hammerhead, to the corner portion 103 of the wide width portion 101 in the mask pattern 102 shown in FIG. 15. Specifically, on applying the OPC to a mask pattern 3 such as shown in FIG. 15, a mask pattern 102A after OPC comes to have a shape as shown in FIG. 17.

By transferring such the mask pattern 102A after the OPC onto the substrate, variations of the transfer pattern in shape and size is restrained.

Additionally, as a result of the search of the prior art, the following pamphlet of International Publication No. 01/063653 has been obtained.

According to the pamphlet of International Publication No. 01/063653, in a Levenson phase-shift mask, when a U-shaped mask pattern is transferred, phase contradiction is produced at phase variation, causing a break of the transfer pattern. To solve the above problem, the mask is divided into two, and using such the masks, a technique of performing multiple exposure has been disclosed.

SUMMARY OF THE INVENTION

Now, as exemplarily shown in FIG. 17, there is a problem that break in wiring is apt to occur, when obtaining the correction pattern 107, using the OPC, by making the narrow width portion, which is originally narrow, still narrower so as to obtain a desired size, a narrow width portion 105A in a transfer pattern 104A becomes extremely narrow, as exemplarily shown in FIG. 18.

Particularly, as exemplarily shown in FIG. 17, in case of a pattern which is not densely arrayed, break in wiring may easily occur in the actual process at the portion of extremely narrow width, because exposure margin is small as compared to a case of a densely arrayed pattern.

In this case, as exemplarily shown in FIG. 19, it is considered to increase the exposure margin by forming dummy patterns 117 in the vicinity of the mask pattern 102A after the OPC such as shown in FIG. 17, and thereby obtaining a densely arrayed pattern. However, even if the exposure margin is increased by forming the dummy patterns 117, a narrow width portion 105B in a transfer pattern 104B is still extremely narrow, as shown in FIG. 20. Namely, even when forming the dummy patterns 117, it is still difficult to solve the above-mentioned problem, that is, the problem of easy occurrence of break in wiring because of the narrow width portion 105B in the transfer pattern 104B becoming extremely narrow.

Further, as shown in FIG. 15, when the narrow width portion 100 is sandwiched between each wide width portion 101, the shape in the boundary portion between the narrow width portion 100 and the wide width portion 101 varies due to slight fluctuation in the process. Therefore, there is also a problem that size estimation becomes quite difficult when performing the OPC.

In addition, it is difficult to form a hole-shaped pattern securely as a desired transfer pattern.

Accordingly, the present invention has been devised considering the above-mentioned problems. The present invention provides a semiconductor device manufacturing method, a mask manufacturing method, and an exposure method, enabling transfer pattern forming of desired size with high accuracy.

One aspect of the present invention is to provide a method for manufacturing a semiconductor device includes a process of forming a transfer pattern having a line whose width or angle varies, by performing multiple exposure using a plurality of mask shaving different patterns over different mask substrates.

Further, another aspect of the present invention is to provide a method for manufacturing a semiconductor device includes a process of forming a transfer pattern including a hole of a desired size by performing multiple exposure using a plurality of masks having different patterns over different mask substrates, and, as the plurality of masks, a mask having a pattern including a hole of a desired size and a mask having a pattern including a hole smaller than the desired size are used.

Still further, another aspect of the present invention is to provide a mask manufacturing method in a photolithography process for use in forming a transfer pattern including a line whose width or angle varies, and, a plurality of masks are manufactured by dividing a mask pattern for forming the transfer pattern, and by forming respective patterns over different mask substrates.

Further, another aspect of the present invention is to provide an exposure method includes a process of forming a transfer pattern including a line whose width or angle varies, by performing exposure using one mask having one pattern over one mask substrate, and performing exposure using another mask having another pattern over another mask substrate.

Therefore, according to the semiconductor device manufacturing method, the mask manufacturing method and the exposure method in accordance with the present invention, there is a merit of being capable of forming a transfer pattern of desired size with high accuracy.

BRIEF DESCRIPTION OF THE DRAWINGS

FIG. 1(A) and FIG. 1(B) show schematic diagrams illustrating two mask patterns for use in a first embodiment of the present invention, in which FIG. 1(A) shows a mask pattern having a wide width portion, while FIG. 1(B) shows a mask pattern having a narrow width portion.

FIGS. 3(A) to 3(J) show schematic cross-sectional diagrams for explaining a semiconductor device manufacturing method according to the first embodiment of the present invention.

FIG. 8(A) and FIG. 8(B) show schematic diagrams illustrating two mask patterns for use in a third embodiment of the present invention, in which FIG. 8(A) shows an L-shaped pattern after OPC, while FIG. 8(B) shows a minute pattern.

FIG. 11(A) and FIG. 11(B) show schematic diagrams illustrating two mask patterns used in the third embodiment of the present invention, in which FIG. 11(A) shows a U-shaped pattern after the OPC, and FIG. 11(B) shows a minute pattern.

DESCRIPTION OF THE PREFERRED EMBODIMENTS

Figure 1A:
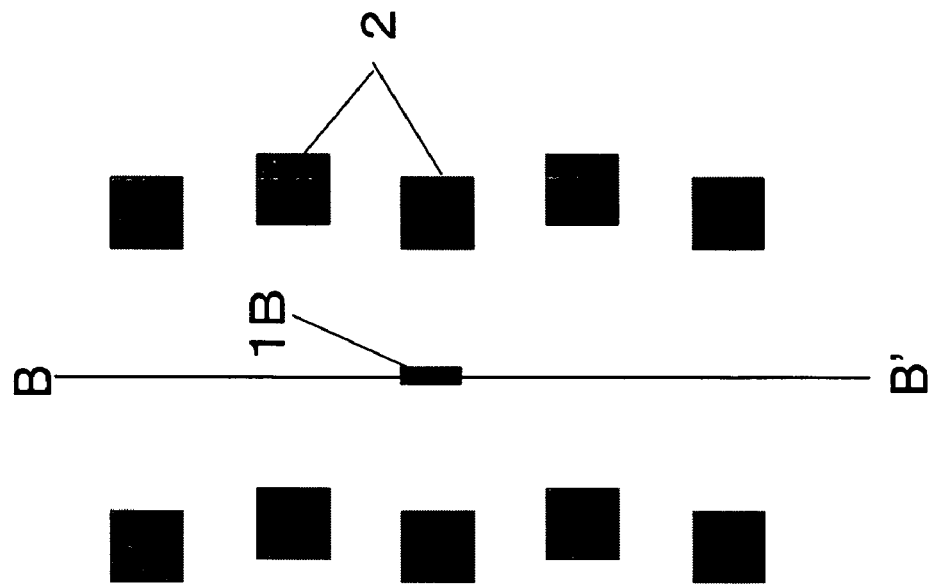

Hereinafter, a semiconductor device manufacturing method, a mask manufacturing method, and an exposure method will be described referring to the drawings.

First Embodiment

First, the semiconductor device manufacturing method, the mask manufacturing method, and the exposure method according to a first embodiment of the present invention will be described, referring to FIGS. 1(A), 1(B), 2, 3(A) to 3(J), and 4.

According to the present invention, multiple exposure is performed using a plurality of masks so as to obtain a transfer pattern of desired size (desired resist size).

Figure 1B:
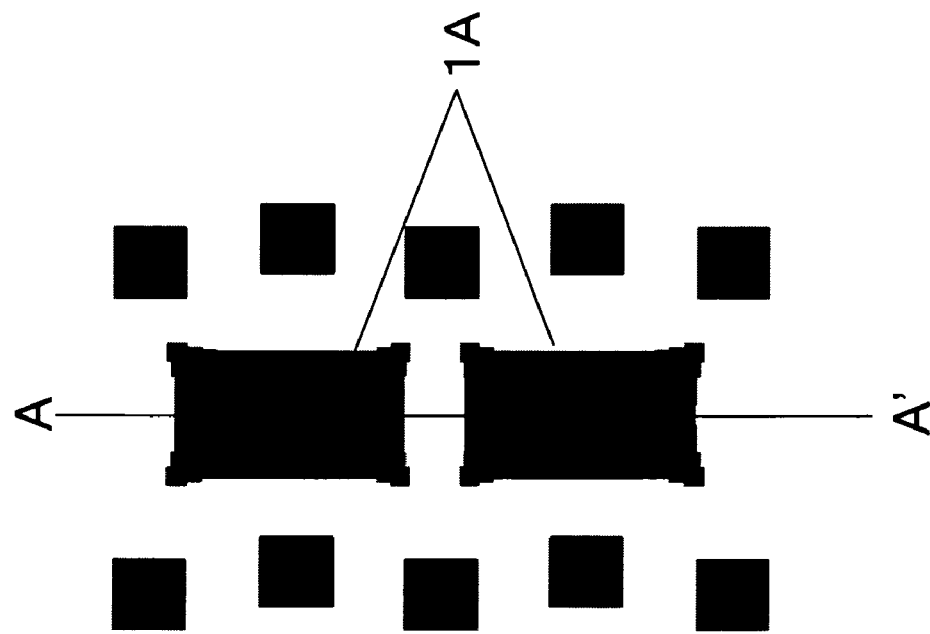

In the exposure method according to the present embodiment, the exposure is performed using one mask having, for example, one mask pattern 1A as shown in FIG. 1(A) over one mask substrate, and there after, the exposure is performed using another mask having another mask pattern 1B, as exemplarily shown in FIG. 1(B), over another mask substrate.

Figure 2:
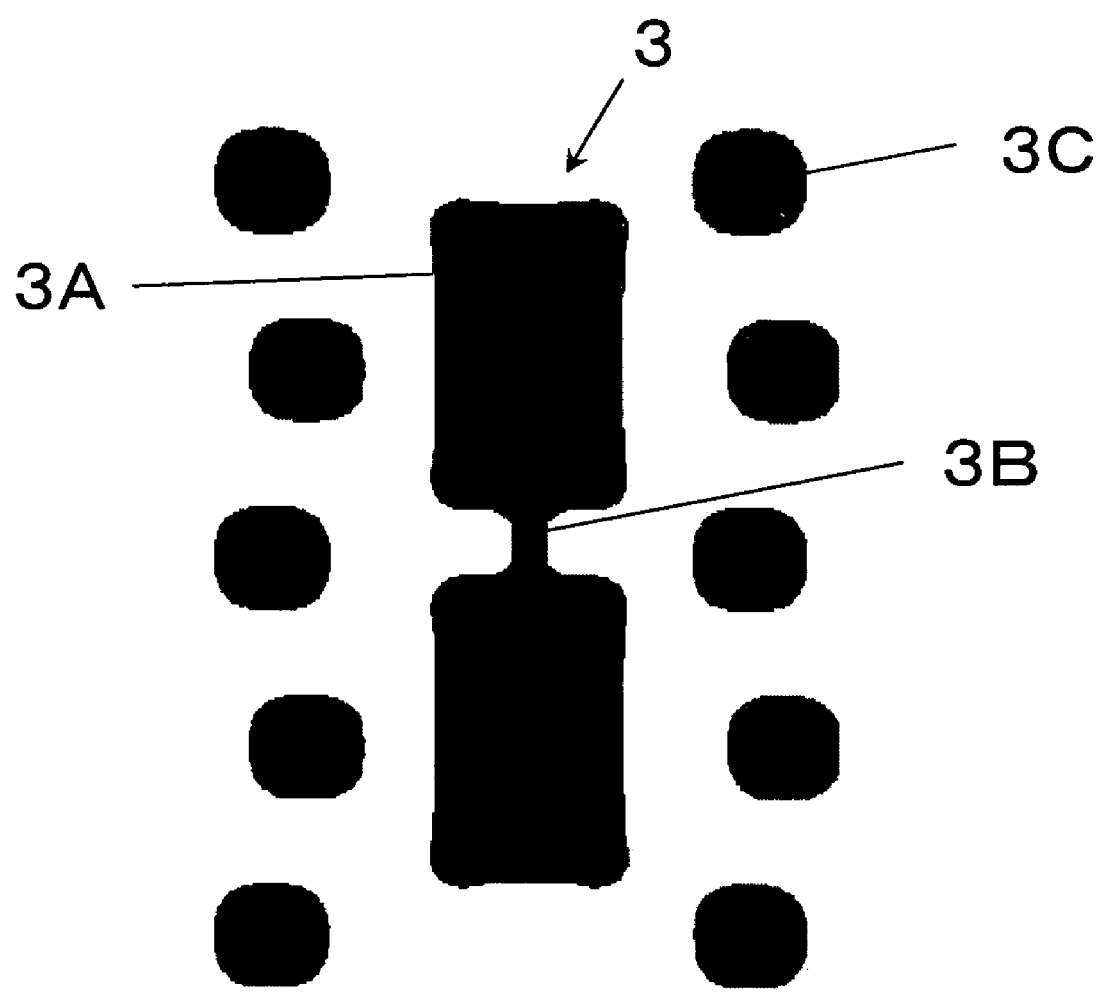
FIG. 2 shows a schematic diagram illustrating a pattern obtained by transferring the two mask patterns used in the first embodiment of the present invention.

As such, by performing double exposure (multiple exposure) using one mask and the other mask, both the one mask pattern 1A and the other mask pattern 1B are transferred onto a substrate (wafer). Thus, a desired transfer pattern 3 is formed over the substrate, as shown in FIG. 2.

Additionally, here, the exposure is performed so that the light transmitting through one mask has the same phase as the light transmitting through the other mask.

In the present embodiment, the mask pattern after the OPC, including a wide width portion and a narrow width portion, is divided at the boundary between the wide width portion and the narrow width portion, with a dummy pattern 2 left unchanged, and thereby the following two masks are formed: as one pattern 1A such as shown in FIG. 1(A), one mask having the wide width portion; and, as the other pattern 1B such as shown in FIG. 1(B), the other mask having the narrow width portion. In other words, by dividing a desired pattern at the portion whose line width constituting the desired pattern varies, the one mask and the other mask are formed.

When performing the exposure using the masks formed above, as an exposure apparatus, for example, the apparatus having a reduced size projection system of which reduction rate is 1/4 times (i.e. mask pattern size: pattern size on the transferred image-formation plane =4:1), with a light source of an ArF excimer laser (for example, a wavelength of 193 nm) having a lens of which numerical aperture is, for example, 0.80, may well be used.

By means of photolithography, first, for example, the wide width portion is transferred onto a resist being coated over the substrate (wafer) by using one mask having the wide width portion as mask pattern 1A. Subsequently, the narrow width portion is transferred onto the resist being coated over the substrate (wafer) by using the other mask having the narrow width portion as mask pattern 1B. As a result, as shown in FIG. 2, a desired transfer pattern 3 (including, a wide width portion 3A having a width of, for example, 550 nm, an arrow width portion 3B having a width of, for example, 100 nm, and a dummy pattern 3C) is formed over the resist being coated over the substrate. Here, each size shown above represents the pattern size formed over the image-formation plane.

By transferring the mask pattern in the above-mentioned manner, the center portion of the narrow width portion 3A in the transfer pattern 3 does not become narrow, as shown in FIG. 2. Thus, the width of the narrow width portion 3A in the transfer pattern 3 becomes a desired width (for example, 100 nm or of that order), and accordingly, the transfer pattern having a desired size is formed with high accuracy. In particular, the present invention is effective when forming the transfer pattern 3 in which the width of the wide width portion is twice as large as or larger than the width of the narrow width portion.

Particularly, according to the present embodiment, since the dummy pattern 2 exists in the vicinity of the narrow width portion 1B, and thereby the pattern becomes densely arrayed, the narrow width portion 1B is transferred with an exposure margin.

Additionally, according to the present embodiment, two masks including a portion of the mask pattern for forming the desired transfer pattern are manufactured (mask manufacturing method) by dividing the mask (for example, the mask having the mask pattern after the OPC) being used for forming the desired transfer pattern including a line whose width or angle varies in the photolithography process, and by forming each pattern over the different mask substrate. However, it is not limited to the above-mentioned method. For example, it may also be possible to form a plurality of masks by dividing the desired pattern into three patterns, or more. In such a case, multiple exposure is to be performed using, as other masks, a plurality of masks having different patterns.

Further, according to the present embodiment, the dummy patterns are provided in the vicinity of the respective mask patterns. However, if the mask patterns are densely arrayed (for example, if the ratio of the line width to the pitch is on the order of 1:4), it is not necessary to provide the dummy patterns. Also, here, the dummy patterns provided over the respective masks are of the same pattern. However, it may be possible to provide different dummy patterns, unless the dummy patterns are connected to each other. Moreover, according to the present invention, the desired pattern can be transferred with high accuracy, even without providing the dummy patterns.

Next, a semiconductor device manufacturing method according to the present embodiment will be described.

The present semiconductor device manufacturing method includes a process of forming a desired transfer pattern having a line whose width or angle varies, by performing multiple exposure, using a plurality of masks having different patterns over different mask substrates.

Specifically, the method includes a process of forming a desired transfer pattern having a line whose width or angle varies, by performing exposure using one mask having one pattern over one mask substrate, and performing exposure using another mask having another pattern over another mask substrate.

Hereinafter, the present semiconductor device manufacturing method will be described concretely, referring to FIGS. 3(A) through 3(J).

According to the present embodiment, the present invention is applied to form wiring (wiring pattern) connecting lower layer wiring and upper layer wiring being formed over the semiconductor substrate.

First, as shown in FIG. 3(A), a semiconductor substrate 10, over which a transistor 11 and lower layer wiring 12 are formed in advance, is prepared.

Subsequently, as shown in FIG. 3(B), an interlayer film 13 (for example, 300 nm in thickness) constituted of, for example, a silicon oxide carbon film is formed over the lower layer wiring 12. Next, over the interlayer film 13, a thin film 14 of, for example, a silicon nitride film (for example, 150 nm in thickness) is formed, which becomes a mask at the time of etching.

Next, as shown in FIG. 3(C), an anti reflection film 15 (for example, 80 nm in thickness) of an organic system being formed of, for example, a novolac resin or the like is coated. Further, for example, a positive chemical amplifying resist 16 (for example, 250 nm in thickness) of an organic system is coated.

Thereafter, by performing exposure using a mask having the mask pattern shown in FIG. 1(A) (that is, a mask having the wide width portion 1A as mask pattern), the wide width portion 1A is transferred onto the resist, as shown in FIG. 3(D), thereby forming a latent pattern constituted of the wide width portion 3A and the dummy pattern 3C shown in FIG. 2. Here, FIG. 3(D) is a schematic cross-sectional diagram along the line A-A' of the mask pattern, when the mask pattern shown in FIG. 1(A) is transferred.

Next, by performing exposure using a mask having the mask pattern shown in FIG. 1(B) (that is, a mask having the narrow width portion 1B as mask pattern), the narrow width portion 1B is transferred onto the resist, as shown in FIG. 3(E), thereby forming a latent pattern constituted of the narrow width portion 3B and the dummy pattern 3C shown in FIG. 2. Here, FIG. 3(E) is a schematic cross-sectional diagram along the line B-B' of the mask pattern, when the mask pattern shown in FIG. 1(B) is transferred.

Here, the mask having the mask pattern shown in FIG. 1(B) is disposed with a positional relation that the line A-A' of the mask pattern shown in FIG. 1(A) is overlaid by the line B-B' of the mask pattern shown in FIG. 1(B). Then, by performing development, the wide width portion 3A is combined with the narrow width portion 3B, and the desired resist pattern (transfer pattern) 3 as shown in FIG. 2 is formed.

Next, as shown in FIG. 3(F), using the resist pattern 3 as mask, an anti reflection film 15 is etched using etching gas of, for example, fluorocarbon.

Subsequently, as shown in FIG. 3(G), using etching gas of, for example, fluorocarbon containing oxygen, a mask thin film 14 is etched. Then, as shown in FIG. 3 (H), through asking by use of, for example, nitrogen or argon, the resist 16 and the antireflection film 15 are removed.

Thereafter, as shown in FIG. 3(I), using the pattern formed over the mask thin film 14 as mask, the interlayer film 13 is etched using etching gas of, for example, fluorocarbon containing oxygen and carbon monoxide.

As a result, the desired pattern 17 is formed over the interlayer film 13.

Then, as shown in FIG. 3(J), by burying a metal such as copper and aluminum into the desired pattern 17, a desired wiring pattern 18 is formed.

Additionally, as described above, according to the present embodiment, exposures are performed separately using the masks having different patterns, which are the mask having the narrow width portion 1B as mask pattern and the mask having the wide width portion 1A as mask pattern. Therefore, by adjusting the exposure value when using the mask having the narrow width portion 1B, it is easily possible to adjust the line width of the narrow width portion 3B in the transfer pattern 3.

Thus, according to the semiconductor device manufacturing method, the mask manufacturing method, and exposure method of the present embodiment, there are merits that a transfer pattern width can be controlled precisely, and that the transfer pattern of desired size can be formed with high accuracy. In particular, even when a narrow width portion is included in a mask pattern, there is a merit that it is possible to obtain the transfer pattern of desired size without either an extremely narrow width or break in wiring.

Figure 4:
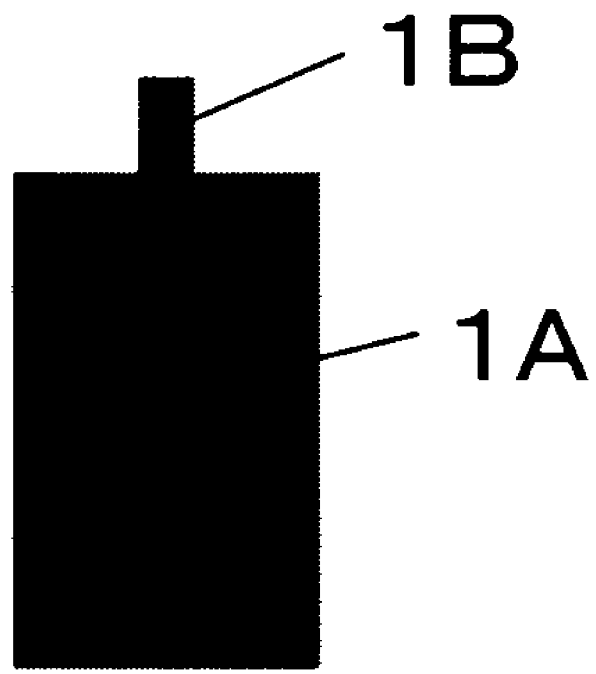
FIG. 4 shows a schematic diagram illustrating a modified example of the mask pattern according to the first embodiment of the present invention.

In the present embodiment, the present invention has been described using an exemplary application for the transfer of the mask pattern in which the narrow width portion 1B is sandwiched by each wide width portion 1A, as shown in FIG. 2. However, the application of the present invention is not limited thereto. For example, as shown in FIG. 4, the present invention is applicable to a case of mask pattern transfer in which the narrow width portion 1B is connected to one end of the wide width portion 1A. In this case, the mask pattern is divided into the wide width portion 1A and the narrow width portion 1B, and after the exposure by use of the mask having the wide width portion 1A as mask pattern, double exposure (multiple exposure) may well be performed using the mask having the narrow width portion 1B as mask pattern.

Second embodiment

Next, a semiconductor device manufacturing method, a mask manufacturing method, and an exposure method according to a second embodiment of the present invention will be described, referring to FIGS. 5 through 7.

In contrast to the above-mentioned first embodiment, the exposure method according to the present embodiment is different in the following point: The mask (for example, the mask having the mask pattern after the OPC) for use in forming a desired transfer pattern including a line whose width or angle varies in the photolithography process is used as one mask without dividing, so as to perform double exposure (here, double exposure) on only the narrow width portion.

Specifically, in the present exposure method, the following point is different: A mask (for example, a mask having the mask pattern after the OPC; for example, refer to FIG. 19) having a desired pattern including a portion at which the line width varies (here, a desired pattern having both the narrow width portion and the wide width portion; basic pattern) is set as one mask. Meanwhile, as another mask, a mask (also having the dummy pattern 2, here) having a minute pattern (a pattern whose width is approximately the same as or smaller than the narrow width portion; correction pattern) 20 being disposed in a position corresponding to the narrow width portion in the desired pattern, as shown in FIG. 5, is set. Then, double exposure (multiple exposure) is performed on only the narrow width portion.

Figure 5:
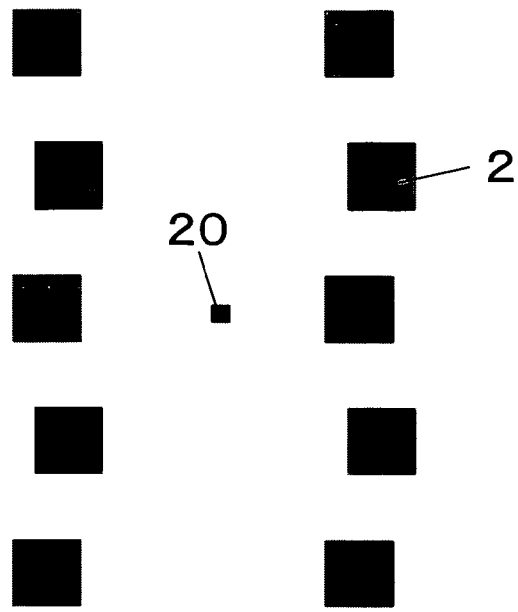
FIG. 5 shows a schematic diagram illustrating a mask pattern having a minute pattern for use in a second embodiment of the present invention.

In the present embodiment, the plurality of (here, two) masks, namely, the mask in which the dummy pattern is disposed over the mask pattern after the OPC (basic pattern) (refer to FIG. 19) and the mask (also having the dummy pattern 2, here) having the minute pattern 20 in a position corresponding to the narrow width portion in the mask pattern after the OPC, as shown in FIG. 5, are used. Here, the size of the minute pattern 20 is, for example, 80×80 nm.

Figure 19:
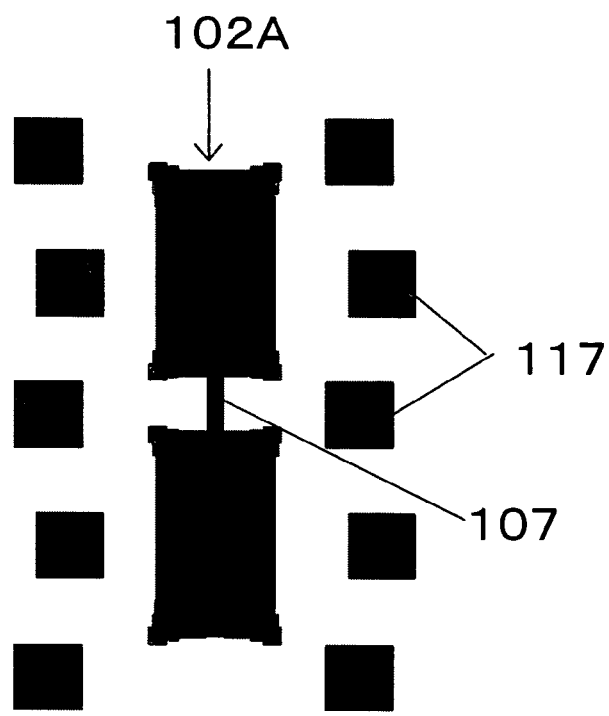
FIG. 19 shows a schematic diagram illustrating the mask pattern having a dummy pattern provided to the pattern after the OPC shown in FIG. 17.
Figure 20:
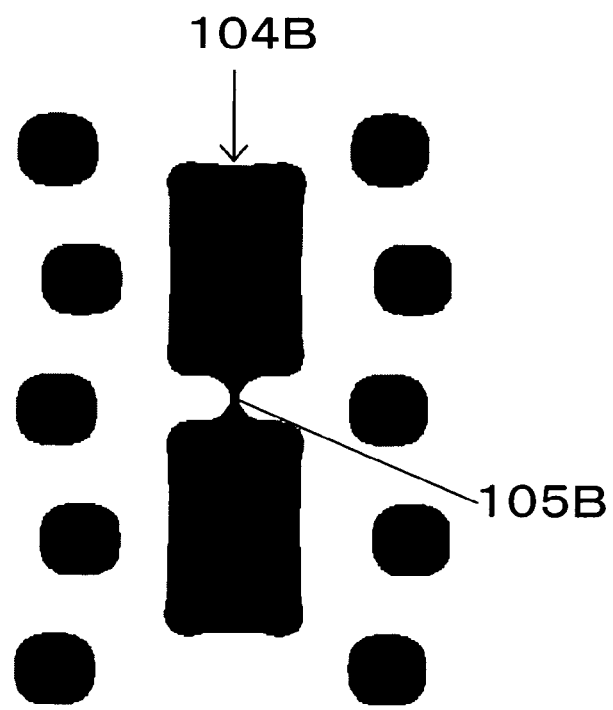
FIG. 20 shows a schematic diagram illustrating the pattern obtained by transferring the mask pattern shown in FIG. 19.

Then, by photolithography, first, the mask pattern after the OPC is transferred onto a resist being coated over the substrate (wafer), using the mask having the mask pattern after the OPC (refer to FIG. 19). Subsequently, the minute pattern 20 is transferred onto the resist being coated over the substrate (wafer) using the mask (also having the dummy pattern 2, here) having the minute pattern 20. Then, double exposure (multiple exposure) is performed on only the narrow width portion transferred onto the substrate (wafer). As a result, as shown in FIG. 6, a desired pattern 3' (including a wide width portion 3A', a narrow width portion 3B' and a dummy pattern 3C') is formed over the resist coated over the substrate.

Figure 6:
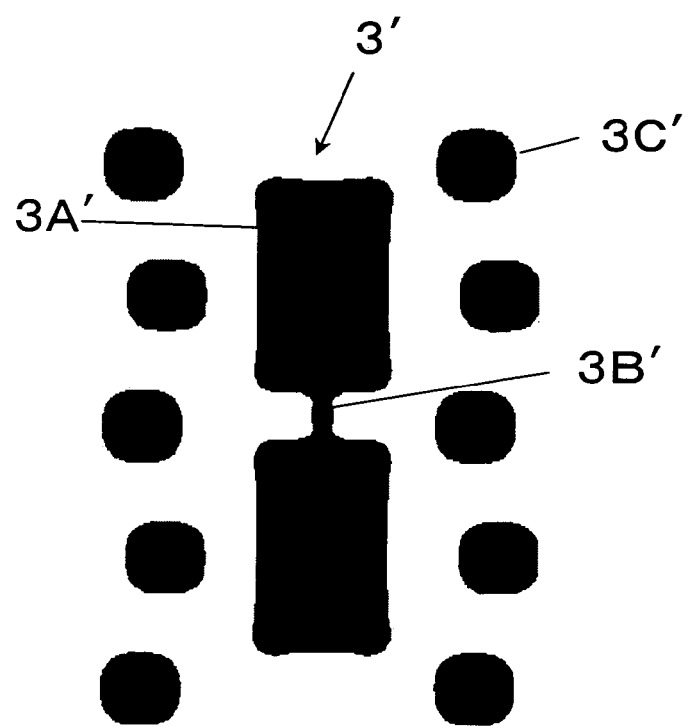
FIG. 6 shows a schematic diagram illustrating a pattern obtained by transferring two mask patterns used in the second embodiment of the present invention.

When the mask pattern is transferred in the above-mentioned manner, the center portion of the narrow width portion 3A' in the transfer pattern 3' did not become narrow, as shown in FIG. 6. The width of the narrow width portion 3A' in the transfer pattern 3' became a desired width (for example, 100 nm or of that order). Thus, the transfer pattern of desired size was formed with high accuracy.

As described above, according to the present embodiment, the exposure is performed separately, using the masks having different patterns: the mask having both the wide width portion 1A and the narrow width portion 1B as mask pattern, and the mask having the minute pattern 20 as mask pattern. Accordingly, by adjusting the exposure value when using the mask having the minute pattern 20, it becomes possible to easily adjust the line width of the narrow width portion 3B' in the transfer pattern 3'.

Figure 7:
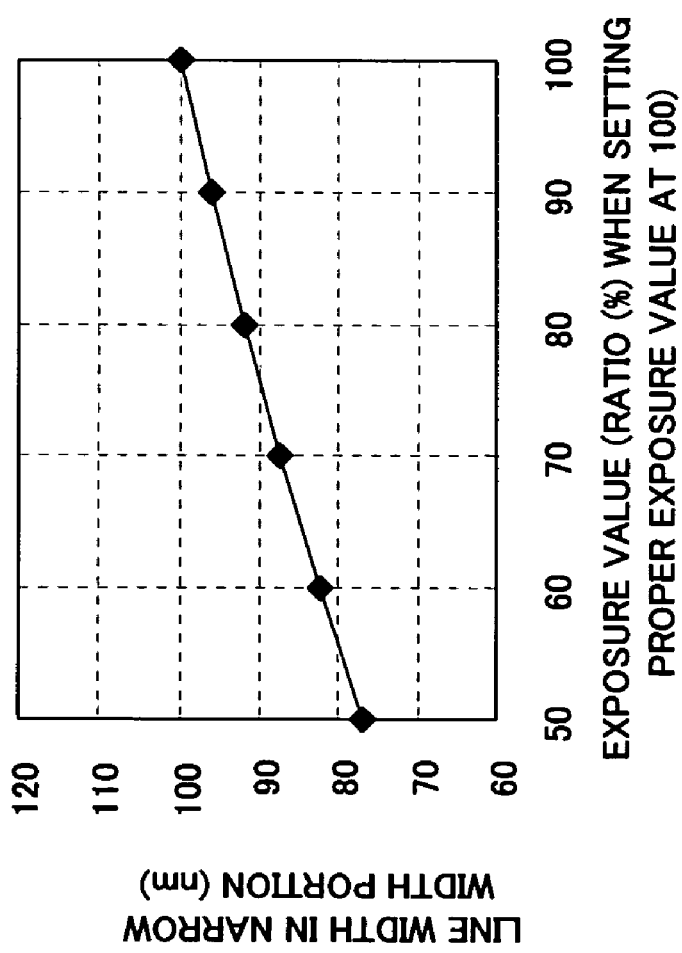
FIG. 7 shows a diagram illustrating a relationship between a line width of the narrow width portion and an exposure value obtained by transferring the mask patterns according to the second embodiment of the present invention.

FIG. 7 shows the result of measuring the line width of the narrow width portion 3B' by varying the exposure value for the minute pattern 20 (a ratio when setting a proper exposure value to 100). Additionally, in the measurement result shown here, under exposure by 0-50% to the proper exposure value was set as the exposure value for the minute pattern 20.

As shown in FIG. 7, when exposing the minute pattern 20 under the proper exposure value (100%), the narrow width portion 3B' having the desired line width size of 100 nm can be obtained. Further, when performing the exposure with a decreased exposure value, at 75% of the proper exposure value, the line width size becomes 90 nm. Thus, the narrow width portion 3B' having a narrower width is obtained. As such, it is understood that, by adjusting the exposure values, the line width of the narrow width portion 3B' is easily adjustable.

Other details are identical to those of the first embodiment described above, and therefore, the description is omitted here.

Thus, according to the semiconductor device manufacturing method, the mask manufacturing method and the exposure method of the present embodiment, similar to the methods of the above-mentioned first embodiment, there are merits that a transfer pattern width can be controlled precisely by the mask manufacturing method and the exposure method, and that the transfer pattern of desired size can be formed with high accuracy. In particular, even when a narrow width portion is included in a mask pattern, there is a merit that the transfer pattern of desired size is obtainable without producing either an extremely narrow width or break in wiring.

In the present embodiment, the above description has been made by taking as an example a case such that the desired transfer pattern is a linear pattern constituted of the narrow width portion and the wide width portion. However, the present invention is not limited thereto. For example, the present invention is applicable when the desired transfer pattern is a pattern including a hole of desired size. In this case, after performing exposure using a mask having a pattern (basic pattern) including the hole of desired size, double exposure (multiple exposure) may well be performed using a mask having a pattern (correction pattern) including a hole smaller than the desired size. With this, it becomes possible to securely form the transfer pattern including the hole of desired size.

Also, as the aforementioned modified example of the first embodiment (refer to FIG. 4), when transferring the mask pattern in which then arrow width portion 1B is connected to one end of the wide width portion 1A, after exposing by use of the mask having the mask pattern in which the narrow width portion 1B is connected to one end of the wide width portion 1A, double exposure (multiple exposure) may well be performed on only the portion corresponding to the narrow width portion 1B, by use of a mask having a minute pattern in a position corresponding to the narrow width portion 1B.

Third Embodiment

Next, in regard to a semiconductor device manufacturing method, a mask manufacturing method and an exposure method according to a third embodiment of the present invention, the description will be made with reference to FIGS. 8(A), 8(B), 9, 10, 11(A), 11(B), 12 and 13.

In contrast to the above-mentioned second embodiment, the exposure method according to the present embodiment differs in the shape of a desired pattern, as well as in a portion on which double exposure (multiple exposure) is performed. Specifically, in the present exposure method, a mask having a mask pattern (for example, a desired mask pattern including an L-shape or a U-shape) so as to form a desired transfer pattern including a corner portion (a portion at which the line angle varies) is set as one mask. Meanwhile, as another mask, a mask having a pattern disposed in a position corresponding to the portion in the vicinity of the corner portion of the desired pattern is set. Then, double exposure (multiple exposure) is performed on only the corner portion.

Figure 8B:
Figure 8A:
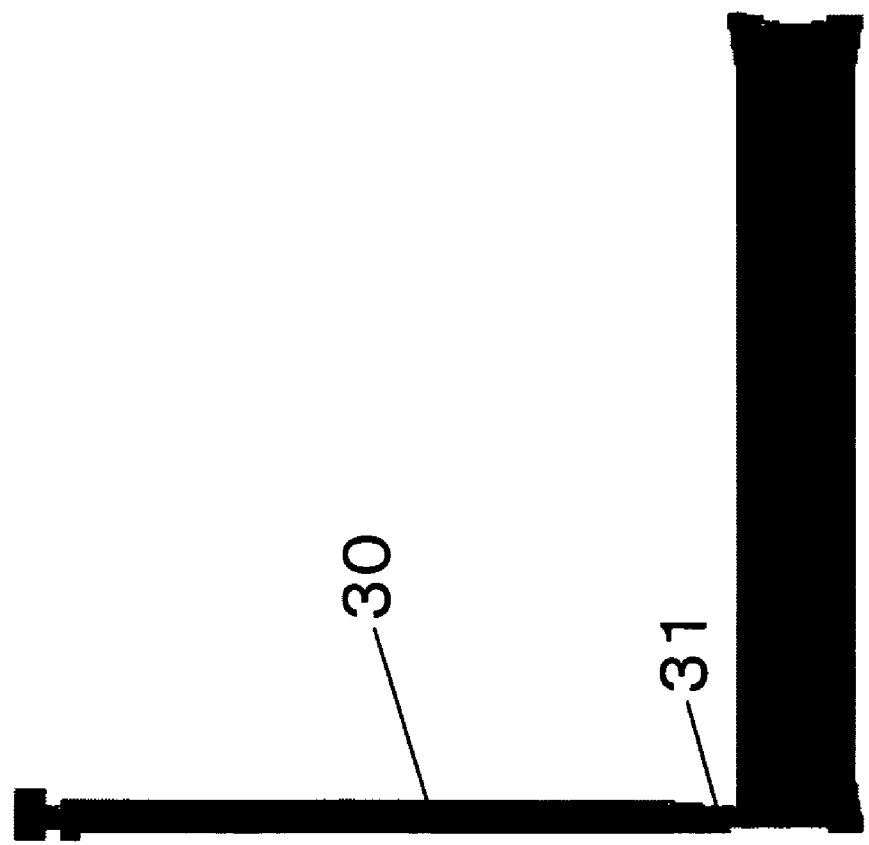

For example, when the desired pattern including the corner portion is a desired pattern including the L-shape, the following two masks are used: a mask having a mask pattern (the mask pattern after the OPC; basic pattern) 30 so as to form the desired transfer pattern including the L-shape such as shown in FIG. 8(A); and as shown in FIG. 8(B), a mask having a minute pattern (a pattern smaller than the portion in the vicinity of the corner portion; correction pattern) 32 being disposed in a position corresponding to a portion 31 in the vicinity of the corner portion of the desired pattern 30 including the L-shape. Here, the width of the portion (root portion of the L-shape) 31 in the vicinity of the L-shaped corner portion before the OPC is, for example, 100 nm. Also, here, the size of the minute pattern 32 is, for example, 80×250 nm. Additionally, in FIGS. 8(A) and 8(B), the dummy pattern is omitted.

Figure 10:
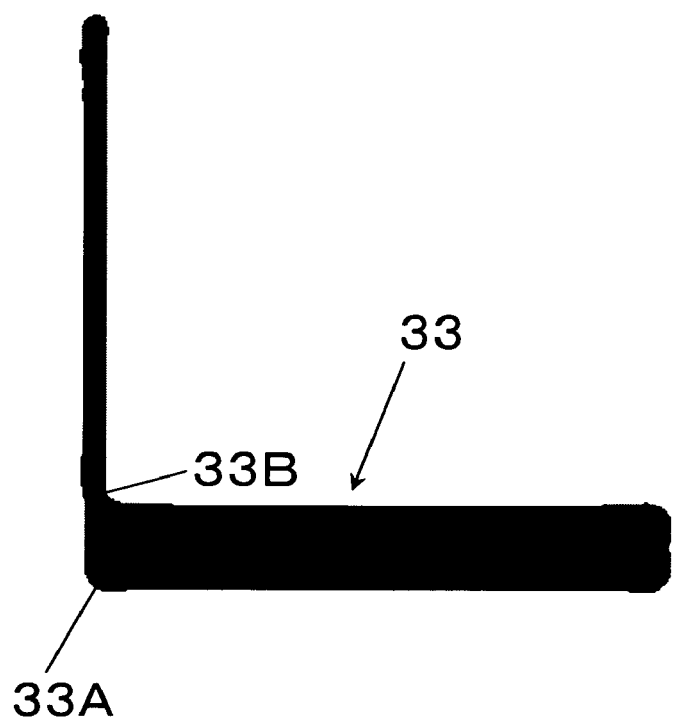
FIG. 10 shows a schematic diagram illustrating a pattern obtained by transferring the two mask patterns used in the third embodiment of the present invention.

Then, by photolithography, first, the mask pattern 30 after the OPC, such as shown in FIG. 8(A), is transferred onto a resist being coated over the substrate (wafer), using the mask having the mask pattern 30 after the OPC. Subsequently, the minute pattern 32 is transferred onto the resist being coated over the substrate (wafer) by using the mask having the minute pattern 32 such as shown in FIG. 8(B). Then, double exposure (multiple exposure) is performed on only the portion in the vicinity of the corner portion being transferred onto the substrate (wafer). As a result, as shown in FIG. 10, a desired transfer pattern 33 (including a corner portion 33A) is formed over the resist coated over the substrate.

Figure 9:
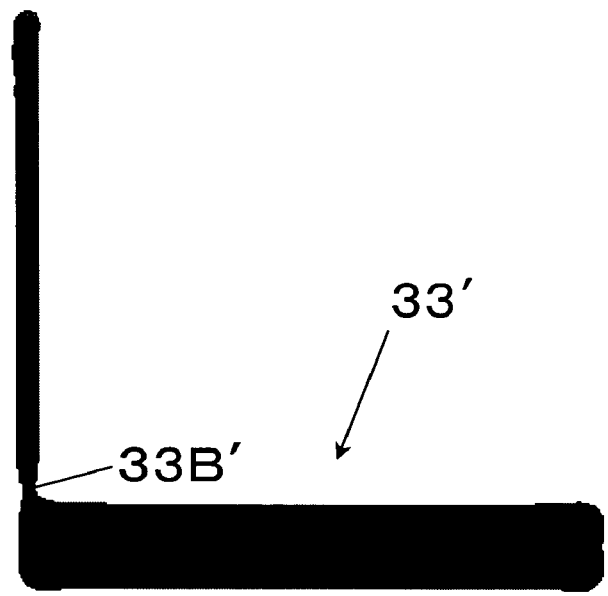
FIG. 9 shows a schematic diagram illustrating a pattern obtained by transferring the L-shaped pattern after the OPC being used in the third embodiment of the present invention.

In this case, at the stage when the mask pattern 30 after the OPC was transferred onto the resist coated over the substrate, by use of the mask having the mask pattern 30 after the OPC such as shown in FIG. 8(A), the width of a portion (root portion of the L-shape) 33B' in the vicinity of the L-shaped corner portion of a transfer pattern 33' became extremely narrow, as shown in FIG. 9. However, after transferring the minute pattern 32 in the above-mentioned manner, as shown in FIG. 10, the width of a portion (root portion of the L-shape) 33B in the vicinity of the L-shaped corner portion of the transfer pattern 33 has become a desired with (for example, 100 nm or of that order). Thus, the transfer pattern of desired size has been formed with high accuracy. In particular, the present invention is effective when forming a transfer pattern whose width of one side of the L-shape is twice as large as or larger than the width of the other side. Here, although the description is made for the case in which each width of the side of L-shape is different, the present invention is also applicable to a case when each width of the side is identical.

Also, here, although the description is made for the exemplary case of the desired pattern including the L-shape, a case that the desired pattern includes a T-shape being formed by elongating either one side is also similar to the above exemplary case.

Figure 11B:
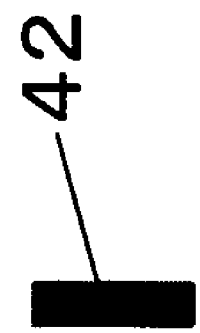
Figure 11A:
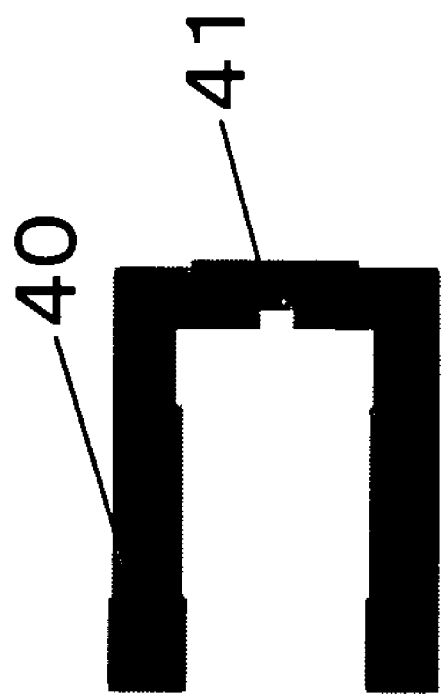

Further, for example, when the desired pattern including the corner portion is a desired pattern including a U-shape, the following two masks are used: a mask having a mask pattern (mask pattern after the OPC; basic pattern) 40 so as to form the desired transfer pattern including the U-shape such as shown in FIG. 11 (A); and, as shown in FIG. 11(B), a mask having a minute pattern (a pattern smaller than the corner portion; correction pattern) 42 being disposed in a position corresponding to a portion 41 in the vicinity of the corner portion of the desired pattern 40 including the U-shape. Here, the width of the portion (base portion of the U-shape) 41 in the vicinity of the U-shaped corner portion before the OPC is, for example, 100 nm. Also, here, the size of the minute pattern 42 is, for example, 70×250 nm. Additionally, in FIGS. 11(A) and 11(B), the dummy pattern is omitted.

Figure 13:
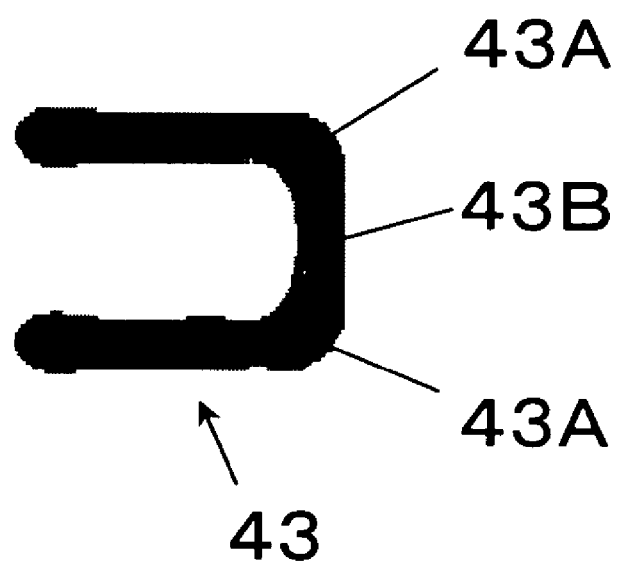
FIG. 13 shows a schematic diagram illustrating a pattern obtained by transferring the two mask patterns used in the third embodiment of the present invention.
Figure 14:
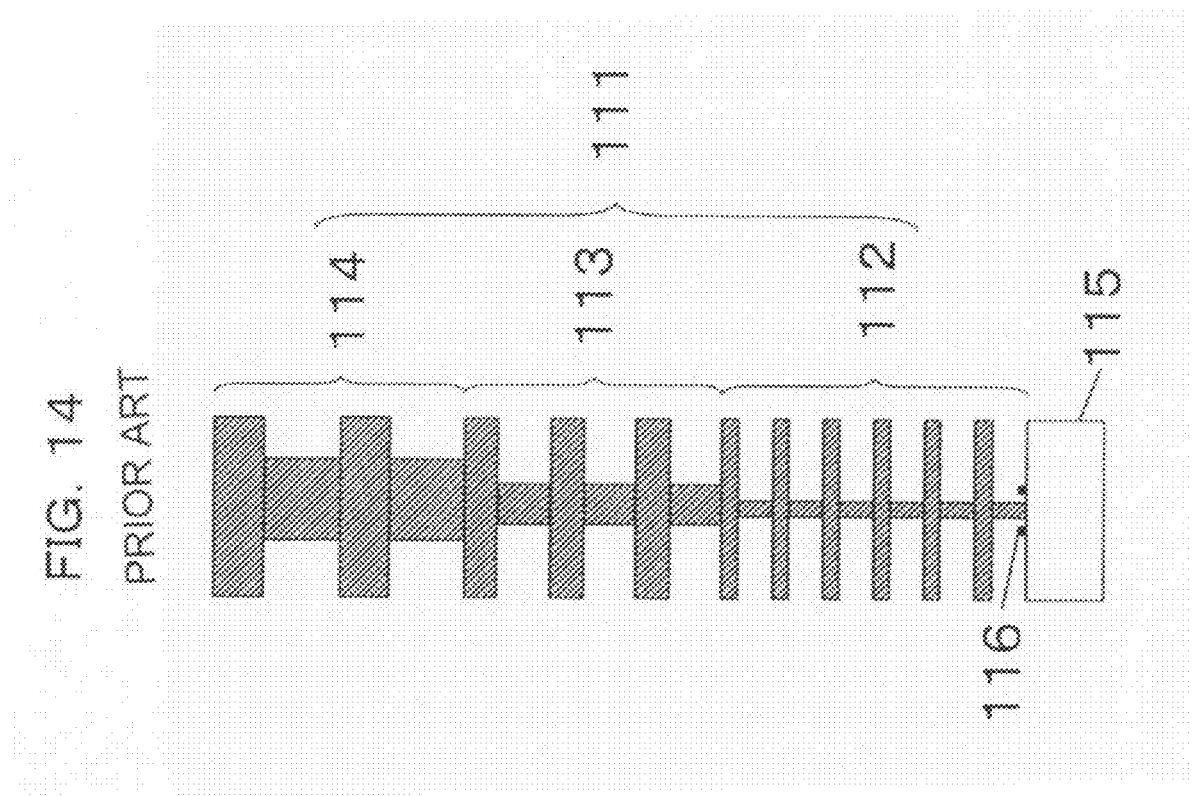
FIG. 14 shows a schematic cross-sectional diagram of a laminate structure of a general semiconductor device.
Figure 15:
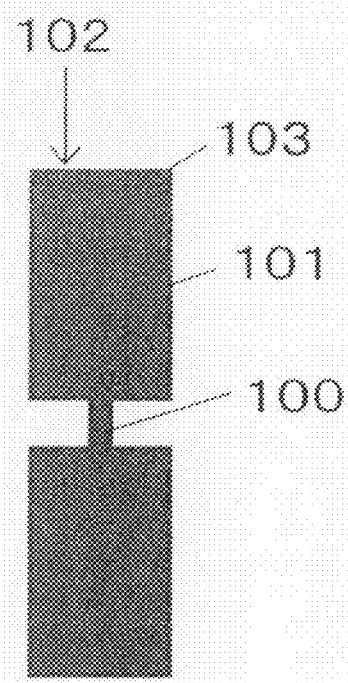
FIG. 15 shows a schematic diagram of a general mask pattern.
Figure 16:
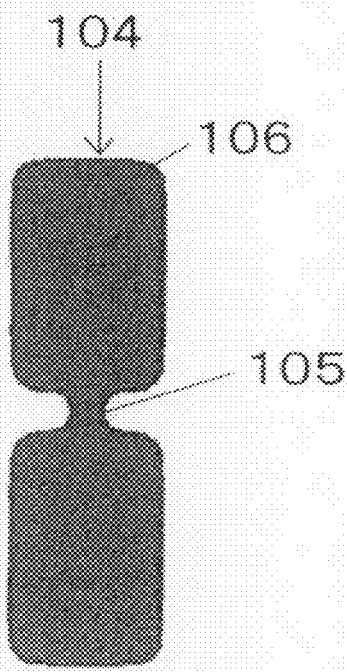
FIG. 16 shows a schematic diagram of the pattern obtained by transferring the mask pattern shown in FIG. 15.
Figure 17:
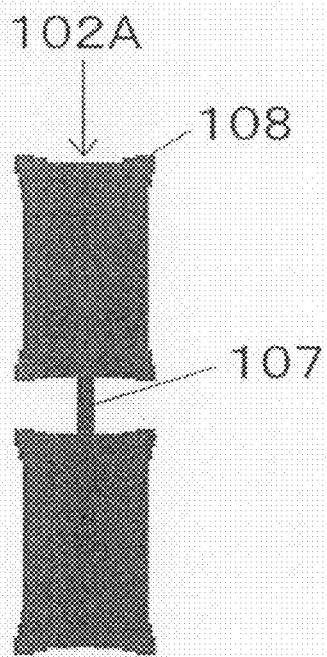
FIG. 17 shows a schematic diagram of a mask pattern after the OPC.
Figure 18:
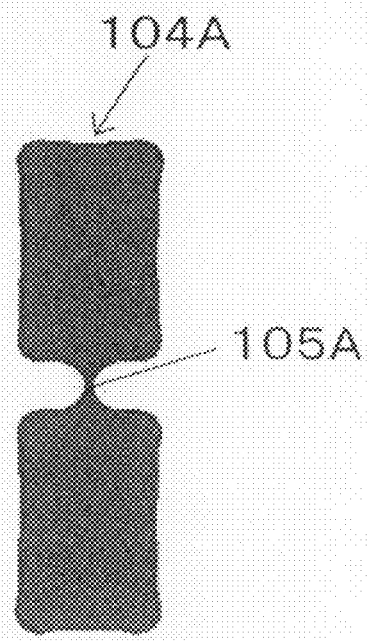
FIG. 18 shows a schematic diagram of the pattern obtained by transferring the mask pattern after the OPC shown in FIG. 17.

Then, by photolithography, first, the mask pattern 40 after the OPC, such as shown in FIG. 11(A), is transferred onto a resist being coated over the substrate (wafer), using the mask having the mask pattern 40 after the OPC. Subsequently, the minute pattern 42 is transferred onto the resist being coated over the substrate (wafer) by use of the mask having the minute pattern 42 such as shown in FIG. 11(B). Then, double exposure (multiple exposure) is performed on only the portion in the vicinity of the corner portion being transferred onto the substrate (wafer). As a result, as shown in FIG. 13, a desired transfer pattern 43 (including a corner portion 43A) is formed over the resist coated over the substrate.

Figure 12:
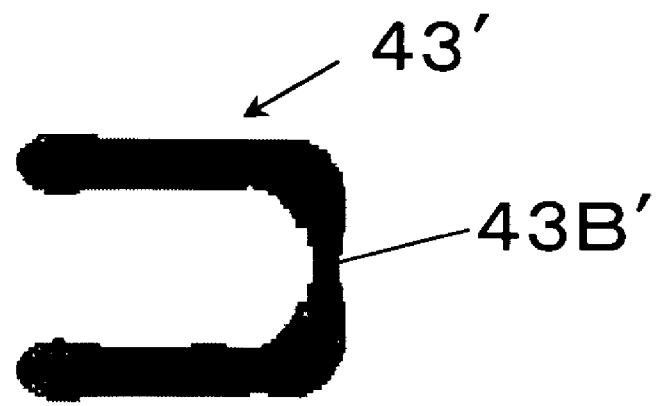
FIG. 12 shows a schematic diagram illustrating a pattern obtained by transferring the U-shaped pattern after the OPC being used in the third embodiment of the present invention.

In this case, at the stage when the mask pattern 40 after the OPC, such as shown in FIG. 11(A), was transferred onto the resist coated over the substrate by use of the mask having the mask pattern 40 after the OPC, the width of a portion (base portion of the U-shape) 43B' in the vicinity of the U-shaped corner portion of a transfer pattern 43' became extremely narrow, as shown in FIG. 12. However, after transferring the minute pattern 42 in the above-mentioned manner, the width of a portion (base portion of the U-shape) 43B in the vicinity of the U-shaped corner portion of the transfer pattern 43 has become a desired width (for example, 100 nm or of that order), as shown in FIG. 13. Thus, the transfer pattern of desired size has been formed with high accuracy. In particular, the present invention is effective when forming a transfer pattern whose width of one side forming the corner portion of the U-shape is twice as large as or larger than the width of the other side.

In addition, other details are identical to those of the second embodiment described above, and therefore, the description is omitted here.

Thus, according to the semiconductor device manufacturing method, the mask manufacturing method and the exposure method of the present embodiment, similar to the methods of the above-mentioned second embodiment, there are merits that a transfer pattern width can be controlled precisely by the mask manufacturing method and the exposure method, and that the transfer pattern of desired size can be formed with high accuracy. In particular, even when a corner portion is included in a mask pattern, there is a merit that the transfer pattern of desired size is obtainable without producing either an extremely narrow width or break in wiring.

Additionally, the present embodiment may be also constituted as a modified example of the aforementioned first embodiment. Namely, one mask and another mask are formed by dividing a desired pattern at the corner portion constituting the desired pattern, and then multiple exposure is performed on the portion in the vicinity of the corner portion.

Others

Note that, the present invention is not limited to the foregoing description of the embodiments. Any suitable modification may be possible within the scope of the invention. For example, any combinations of the above-mentioned embodiments or the modified examples thereof are to be applicable.

What is claimed is:

1. A method for manufacturing a semiconductor device, comprising:

forming a transfer pattern including a line whose width varies, by performing multiple exposure using a plurality of masks having different patterns over different mask substrates, wherein, as the multiple exposure using the plurality of masks, a first exposure using a first mask having a basic pattern for forming the transfer pattern including a wide width portion having a first width and a narrow width portion having a second width narrower than the first width, and a second exposure using a second mask having a correction pattern whose width is smaller than the narrow width portion in a position corresponding to the narrow width portion of the transfer pattern are performed, and a light used in the first exposure and transmitting through the first mask has the same phase as a light used in the second exposure and transmitting through the second mask.

2. The method for manufacturing the semiconductor device according to claim 1, wherein at least one of the first mask and the second mask has a dummy pattern in the vicinity of the pattern.

3. A method for manufacturing the semiconductor device comprising:

forming a transfer pattern including a line whose angle varies, by performing multiple exposure using a plurality of masks having different patterns over different mask substrates, wherein, as the multiple exposure using the plurality of masks, a first exposure using a first mask having a basic pattern for forming the transfer pattern including a corner portion at which the line angle varies and, a second exposure using a second mask having a correction pattern whose width is smaller than a portion in the vicinity of the corner portion in a position corresponding to the portion in the vicinity of the corner portion of the transfer pattern are performed, and a light used in the first exposure and transmitting through the first mask has the same phase as a light used in the second exposure and transmitting through the second mask.

4. The method for manufacturing the semiconductor device according to claim 3, wherein the mask having the basic pattern includes an L-, T- or U-shaped pattern.

5. The method for manufacturing the semiconductor device according to claim 3,
wherein at least one of the first mask and the second mask has a dummy pattern in the vicinity of the pattern.

6. An exposure method comprising:
forming a transfer pattern including a line whose width varies, by performing a first exposure using one mask having one pattern over one mask substrate, and performing a second exposure using another mask having another pattern over another mask substrate,
wherein the one mask includes a basic pattern for forming the transfer pattern including a wide width portion having a first width and a narrow width portion having a second width narrower than the first width,
while the other mask includes a correction pattern whose width is smaller than the narrow width portion in a position corresponding to the narrow width portion of the transfer pattern, and
a light used in the first exposure and transmitting through the one mask has the same phase as a light used in the second exposure and transmitting through the other mask.

7. The exposure method according to claim 6,
wherein multiple exposure is performed using a plurality of masks having different patterns as the other mask.

8. An exposure method comprising:
forming a transfer pattern including a line whose angle varies, by performing a first exposure using one mask having one pattern over one mask substrate, and performing a second exposure using another mask having another pattern over another mask substrate,
wherein the one mask includes a basic pattern for forming the transfer pattern including a corner portion at which the line angle varies,
while the other mask includes a correction pattern whose width is smaller than a portion in the vicinity of the corner portion in a position corresponding to the portion in the vicinity of the corner portion of the transfer pattern, and
a light used in the first exposure and transmitting through the one mask has the same phase as a light used in the second exposure and transmitting through the other mask.

9. The exposure method according to claim 8,
wherein the mask having the basic pattern includes an L-, T- or U-shaped pattern.

10. The exposure method according to claim 8,
wherein multiple exposure is performed using a plurality of masks having different patterns as the other mask.

* * * * *